(12) United States Patent
Hou et al.

(10) Patent No.: US 8,582,040 B2
(45) Date of Patent: Nov. 12, 2013

(54) FUNCTIONAL DEVICE ARRAY WITH SELF-ALIGNED ELECTRODE STRUCTURES AND FABRICATION METHODS THEREOF

(75) Inventors: Chih Sheng Hou, Taipei (TW); Wei-Hsin Hou, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 894 days.

(21) Appl. No.: 12/274,762

(22) Filed: Nov. 20, 2008

(65) Prior Publication Data

US 2009/0303400 A1 Dec. 10, 2009

(30) Foreign Application Priority Data

Jun. 10, 2008 (TW) ................................ 97121511 A

(51) Int. Cl.
*G02F 1/1335* (2006.01)
*G02F 1/1339* (2006.01)
*G06K 11/06* (2006.01)

(52) U.S. Cl.
USPC .......................... 349/12; 349/156; 178/18.03

(58) Field of Classification Search
USPC ................... 178/18.03, 18.05, 18.06; 349/12
See application file for complete search history.

(56) References Cited

U.S. PATENT DOCUMENTS

| | | | |
|---|---|---|---|
| 4,341,445 A * | 7/1982 | Matsuyama et al. | 349/123 |
| 5,159,159 A | 10/1992 | Asher | |
| 5,240,797 A | 8/1993 | Matsushima et al. | |
| 5,707,785 A | 1/1998 | Hsieh et al. | |
| 6,266,121 B1 * | 7/2001 | Shigeta et al. | 349/156 |
| 7,288,429 B2 | 10/2007 | Yaung et al. | |
| 2003/0107868 A1 | 6/2003 | Chatzandroulis et al. | |
| 2004/0165252 A1 * | 8/2004 | Liang et al. | 359/296 |
| 2005/0244590 A1 * | 11/2005 | Hiji et al. | 428/1.1 |
| 2006/0039044 A1 | 2/2006 | Kim | |
| 2006/0272429 A1 | 12/2006 | Ganapathi et al. | |
| 2007/0222922 A1 * | 9/2007 | Jin et al. | 349/110 |
| 2007/0257890 A1 * | 11/2007 | Hotelling et al. | 345/173 |

FOREIGN PATENT DOCUMENTS

| | | |
|---|---|---|
| CN | 1515932 A | 7/2004 |
| TW | 570896 | 1/2004 |
| TW | 573204 | 1/2004 |
| TW | 200419281 A | 3/2007 |

OTHER PUBLICATIONS

China Patent Office, Office Action, Patent Application Serial No. 200810128535.1, Nov. 17, 2011, China.
Taiwan Patent Office, Office Action, Application Patent Serial No. 97121511, Apr. 26, 2012, Taiwan.
Taiwan Patent Office, Office Action, Patent Application U.S. Appl. No. 097121511, Office Action, Taiwan.

* cited by examiner

*Primary Examiner* — Michael Caley

(57) ABSTRACT

A functional device array with self-aligned electrode structures and fabrication methods thereof are presented. The functional device array includes a transparent substrate. A patterned lower electrode array is disposed on the transparent substrate. A spacer structure is disposed overlying the transparent substrate and located between the patterned lower electrodes self-aligned therewith. A functional structure layer is disposed in an array of pixel regions defined by the spacer structure. A patterned upper substrate is disposed on the functional structure layer corresponding to each of the pixel regions, and a passivation layer is disposed on the patterned upper electrode covering the functional device array.

34 Claims, 23 Drawing Sheets

FUNCTIONAL DEVICE ARRAY WITH SELF-ALIGNED ELECTRODE STRUCTURES AND FABRICATION METHODS THEREOF

CROSS REFERENCE TO RELATED APPLICATIONS

This application is based upon and claims the benefit of priority from a prior Taiwanese Patent Application No. 097121511, filed on Jun. 10, 2008, the entire contents of which are incorporated herein by reference.

BACKGROUND OF THE INVENTION

1. Field of the Invention

The invention relates to a functional device array, and in particular to a functional device array with self-aligned electrode structures and fabrication methods thereof.

2. Description of the Related Art

A conventional functional device array includes piezoelectric sensitive devices, display devices, actuation devices, loudspeaker devices, and other optoelectronic sensor devices, which are developing towards miniaturizing while increasing effective pixel areas. Typical functional device arrays contain three components: a substrate, a spacer structure, and functional structure layers of a sensor device. An array of pixel areas is defined by the spacer structure, and the functional structure layers of a sensor device are then formed in each pixel area. Therefore, precision and efficiency for defining and fabricating the pixel area is critical for functional device arrays.

U.S. Pub. No. 2006/0039044, the entirety of which is hereby incorporated by reference, discloses a method for self-alignment of Red-Blue-Green color filters on a photodetector. A photodetector is provided with a planarized device surface. Subsequently, two dielectric layers are deposited on the photodetector defining a predetermined area. Each color of the color filters is sequentially formed on the predetermined area. After an upper layer of the dielectric layers is removed, each color filter is self-aligned with the detecting region of the photodetector.

FIGS. 1A-1D are cross sections illustrating each fabrication step for a conventional functional device array 10. Referring to FIG. 1A, a substrate 11 is provided with patterned electrodes 13 formed thereon. For example, an array of electrodes 13 are defined on the substrate 11 by using a first photomask (not shown) configured with a lithography process.

Referring to FIG. 1B, a dielectric layer 14 is formed on the substrate 11. A spacer structure is defined by a second photomask 21 configured with a lithography process, as shown in FIG. 1C. Specifically, a front exposure L step is performed to define the spacer structure, wherein the opaque area 21a of the second photomask is corresponding to the pixel area, and the transparent area 21b is corresponding to the spacer structure. Defining the spacer structure 15 by the second photomask not only requires precise alignment with the substrate 11 but also requires precise alignment with a previous first photomask. As device density increases and device dimensions shrink, misalignment errors easily occur, such that a spacer 15' deviates from its original site resulting in inconsistent pixel areas, as shown in FIG. 1C.

Referring to FIG. 1D, functional structure layers 17 of a sensor device are formed on the pixel areas, thus completing the functional device array 10. In order to compensate for spacer deviations, dimensions of the spacer 15 must be greater than the separation distance d between the patterned electrodes, thereby generating a boundary margin s to offset misalignment. However, the boundary margin s may undesirably deteriorate aperture ratio of the functional devices. That is, the aperture ratio A/W of the actual area A of the functional layers 17 to the ideal pixel area W may be reduce due to the boundary margin s. More specifically, when the boundary margin s is greater; the aperture ratio A/W is smaller. For example, when W=10 µm, the minimum feature size is about 2 µm, and the alignment precision is about ±1 µm, the aperture ratio A/W is only about 60%.

BRIEF SUMMARY OF THE INVENTION

An embodiment of the invention provides a functional device array with self-aligned electrode structures, comprising, a transparent substrate, a patterned lower electrode array disposed on the transparent substrate, a plurality of spacer structures disposed on the transparent substrate, at a gap between the patterned lower electrodes, and self-aligned with the patterned lower electrode array, a functional structure disposed on pixel region array defined by the plurality of spacer structures, a patterned upper electrode disposed on the functional structure corresponding to the pixel region array, and a passivation layer disposed on the patterned upper electrode covering the functional devices.

Note that the functional device array can comprise a touch controlled device array. In addition, a gap can be created between the patterned lower electrode array and the patterned upper electrode. Furthermore, an additional piezoresistive layer can be disposed on the patterned lower electrode array.

Another embodiment of the invention provides a functional device array with self-aligned electrode structures, comprising a transparent substrate, a patterned first lower electrode array disposed on the transparent substrate, a patterned insulation layer disposed on the transparent substrate exposing a portion of the first lower electrode, a patterned second lower electrode disposed on the insulation layer, a plurality of spacer structures disposed on the transparent substrate and self-aligned with a shadow region between the first lower substrate and the second lower substrate, a functional structure disposed on pixel region array defined by the plurality of spacer structures, a patterned upper electrode disposed on the functional structure corresponding to the pixel region array, and a passivation layer disposed on the patterned upper electrode covering the functional devices.

Another embodiment of the invention provides a fabrication method for a functional device array with self-aligned electrode structures, comprising providing a transparent substrate, forming an patterned lower electrode array on the transparent substrate, applying a negative photoresist layer on the transparent substrate covering the patterned lower electrode array, performing a backside exposure and using the patterned lower electrode array as a photomask to define a plurality of spacer structures at a gap between the patterned lower electrodes and self-aligned with the patterned lower electrode array, forming a functional structure on pixel region array defined by the plurality of spacer structures, forming a patterned upper electrode on the functional structure corresponding to the pixel region array, and forming a passivation layer on the patterned upper electrode covering the functional devices.

Another embodiment of the invention provides a fabrication method for a functional device array with self-aligned electrode structures, comprising, providing a transparent substrate, forming an array of patterned first lower electrodes on the transparent substrate, forming a patterned insulation later on the transparent substrate exposing a portion of the first electrode, forming a patterned second lower electrode on the insulation later, applying a negative photoresist layer on the transparent substrate covering the first and the second lower electrodes, performing a backside exposure and using the first and the second lower electrodes as a photomask to define a plurality of spacer structures at a gap between the patterned lower electrodes and self-aligned with a shadow region of the first and the second lower electrodes, forming a functional structure on the pixel region array defined by the plurality of spacer structures, forming a patterned upper electrode on the functional structure corresponding to the pixel region array, and forming a passivation layer on the patterned upper electrode covering the functional devices.

Another embodiment of the invention provides a fabrication method for an functional device array with self-aligned electrode structures, comprising, providing a transparent substrate; forming an patterned lower electrode array on the transparent substrate, applying a negative photoresist layer on the transparent substrate covering the patterned lower electrode array, performing a backside exposure and using the patterned lower electrode array as a photomask to define a plurality of spacer structures at a gap between the patterned lower electrodes and self-aligned with the patterned lower electrode array, forming a sacrificial layer overlying the spacer structures and the patterned lower electrodes, forming a piezoresistive layer on the sacrificial layer, forming a patterned upper electrode on the piezoresistive layer corresponding to the pixel region array, removing the sacrificial layer, and forming a passivation layer on the patterned upper electrode covering the functional devices.

Another embodiment of the invention provides a fabrication method for an functional device array with self-aligned electrode structures, comprising, providing a transparent substrate, forming an patterned lower electrode array on the transparent substrate, applying a negative photoresist layer on the transparent substrate covering the patterned lower electrode array, performing a backside exposure and using the patterned lower electrode array as a photomask to define a plurality of spacer structures at a gap between the patterned lower electrodes and self-aligned with the patterned lower electrode array, forming a piezoresistive layer on the patterned lower electrode array, forming a sacrificial layer overlying the spacer structures and the piezoresistive layer, forming a patterned upper electrode on the piezoresistive layer corresponding to pixel region array, removing the sacrificial layer, and forming a passivation layer on the patterned upper electrode covering the functional devices.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
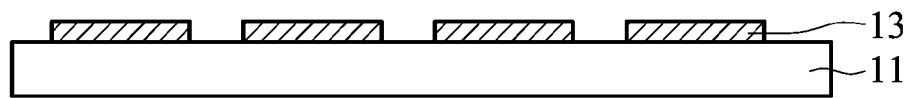
FIGS. 1A-1D are cross sections illustrating each fabrication step for a conventional functional device array.
Figure 1B:
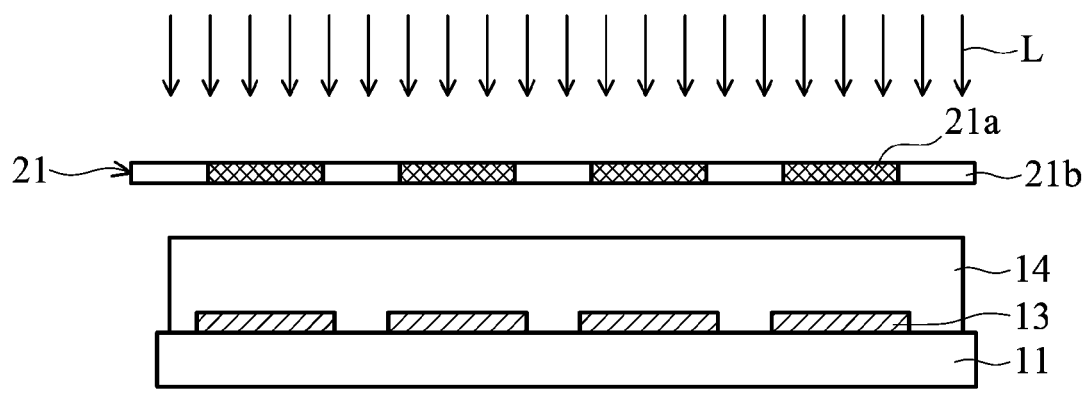
Figure 1C:
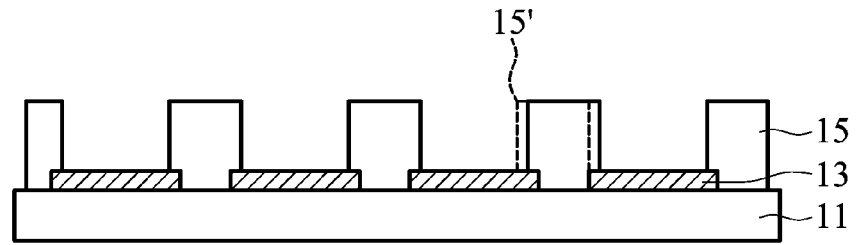
Figure 1D:
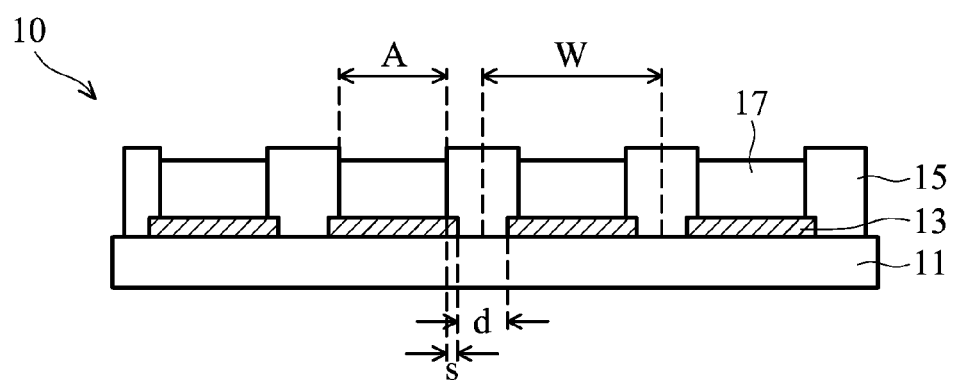

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

Embodiments of the invention provide a functional device array with self-aligned electrode structure and fabrication methods for the same. A patterned lower electrode array is used as a photomask during backside exposure, thereby fabricating the self-aligned spacer structures. A photomask step can be reduced and an optimum aperture for pixels of the device can be achieved.

Figure 2A:
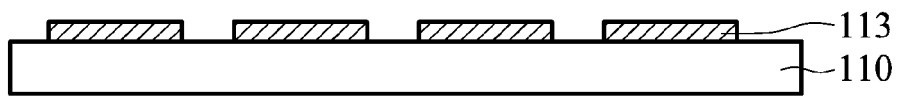
FIGS. 2A-2D are cross sections illustrating an embodiment of each fabrication step for a functional device array of the invention.

FIGS. 2A-2D are cross sections illustrating an embodiment of each fabrication step for the functional device array of the invention. Referring to FIG. 2A, a substrate 110 is provided with patterned electrodes 113 formed thereon. For example, patterned lower electrodes 113 are defined on the substrate 110 by using a first photomask (not shown) configured with a lithography process. The patterned lower electrodes 113 can be an array of electrode structures corresponding to each pixel area of the functional device array. The substrate can be a rigid glass substrate or a flexible polymer substrate with a predetermined transparency.

Figure 2B:
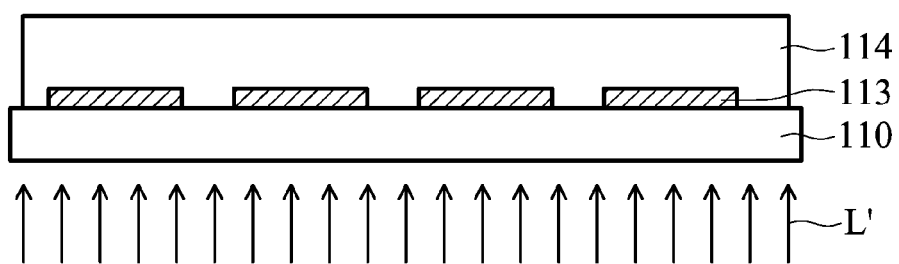
Figure 2C:
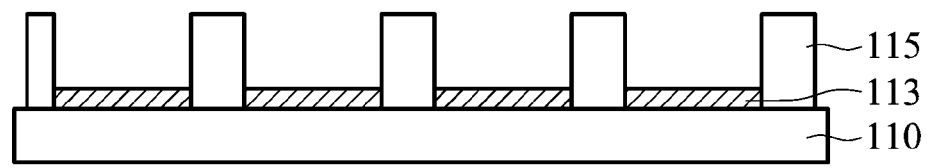

Referring to FIG. 2B, a dielectric layer 114 is formed on the substrate 110. The dielectric layer 114 can be made of a photoresist, polymer or oxides. Subsequently, a backside exposure L' step is performed by using the patterned lower electrodes 113 as a photomask configured with a lithography process to define a spacer structure 115, as shown in FIG. 2C. Since the spacer structure 115 is directly defined by the patterned lower electrodes 113, the edges of the spacer structure 115 are completely self-aligned with the patterned lower electrodes 113. Compared with conventional fabrication methods, the second photomask exposure step to define the spacer structure can be omitted. Moreover, since the spacer structure 115 is completely aligned with the patterned electrodes 113, misalignment defects which cause inconsistent pixel areas can be prevented.

Figure 2D:
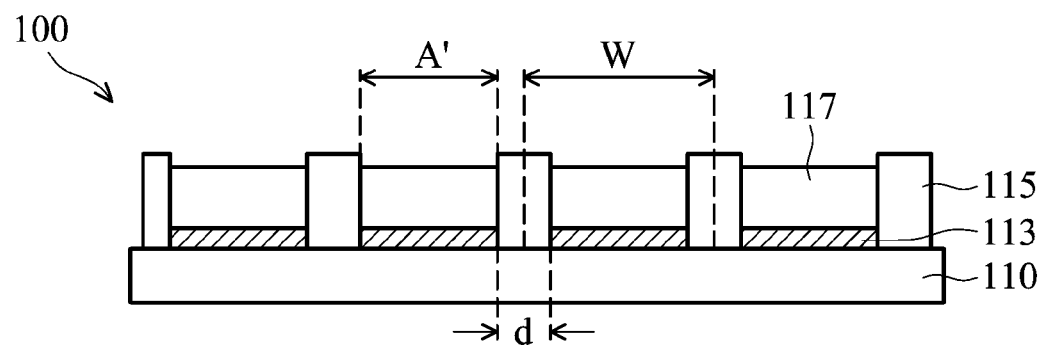

Referring to FIG. 2D, functional structure layers 117 of a sensor device are formed on the pixel areas, thus completing the functional device array 100. According to embodiments of the invention, the aperture ratio A'/W of the actual area A' of the functional layers 117 to the ideal pixel area W can be optimized. More specifically, the width of the spacer structure 115 equals to the separation distance d between the patterned electrodes, so that the aperture ratio A'/W can be optimized. For example, when W=10 μm, the minimum feature size is about 2 μm, and the alignment precision is about ±1 μm. Thus, the aperture ratio A/W can achieve about 80%.

Figure 3A:
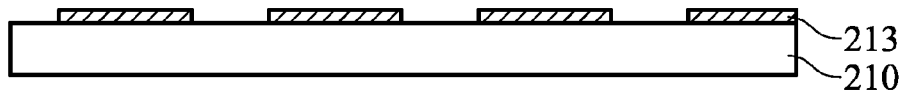
FIGS. 3A-3E are cross sections illustrating each fabrication step for an exemplary embodiment of a sensor device array of the invention.

FIGS. 3A-3E are cross sections illustrating each fabrication step for an exemplary embodiment of a sensor device array of the invention. Referring to FIG. 3A, a substrate 210 such as transparent polyethylene terephthalate (PET), polyetheretherketone, polyethylene naphthalate, blocked isocyanates, silicone based elastomers, polyamides, polyimides, aromatic fluorine polyesters, polyethersulfone, polysulfones, polyacrylates, polycarbonates, poly (styrene-diene) block copolymers, poly (vinyl halides), polyurethanes, poly (urethane acrylates), poly (urethane methacrylates), poly (dimethyl siloxanes), polyetherimides, polymethacrylates, polyolefins, poly (ethylene-acrylate) copolymers, poly (ethylene-methacrylate) copolymers, polyethylene terephthalate, polynaphthalene terephthalate, polydienes, or ionomer substrate with a thickness of 125 μm is provided. Patterned electrodes 213 are subsequently formed on the substrate 210. For example, aluminum electrodes 213 serving as lower electrodes for each pixel are defined on the substrate 210 by using a first photomask (not shown) configured with a lithography process (such as a liftoff process). The dimensions of the patterned electrodes 213 are about 0.5 μm.

Figure 3B:
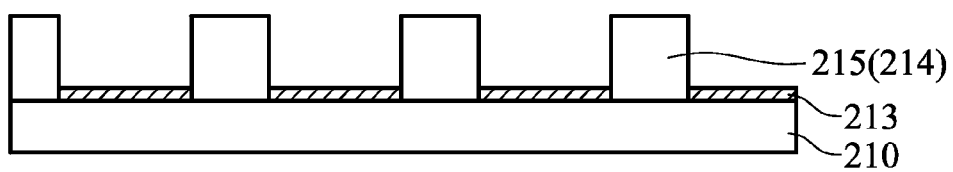

Referring to FIG. 3B, a negative photoresist layer 214 (such as model SU8 2015 which is commercially available by Microchem company) is spun on the substrate 210. Subsequently, a backside ultraviolet (UV) exposure step is performed by using the patterned electrodes 213 as a photomask followed by a post-bake and a develop process to define a spacer structure 215. After a hard-bake process at 200° C., the spacer structure 215 with a thickness of about 30-60 μm is achieved. Since the spacer structure 215 is directly defined by the patterned electrodes 213, the edges of the spacer structure 215 are completely self-aligned with the patterned lower electrodes 213.

Figure 3C:
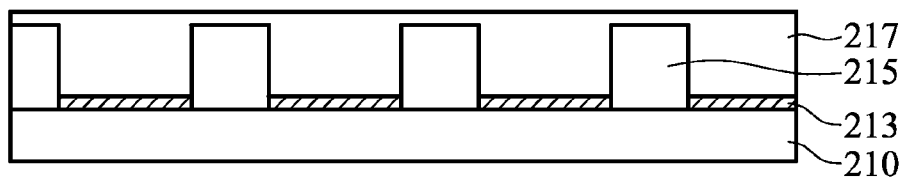
Figure 3D:
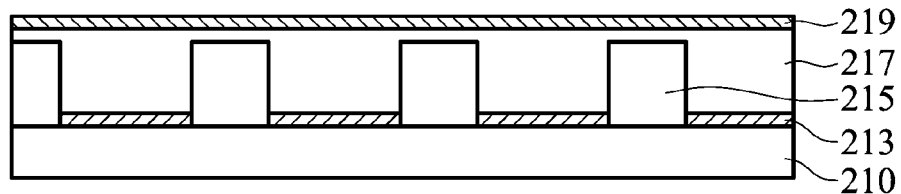

Referring to FIG. 3C, an elastomer layer 217 is applied by screen printing or by stencil printing. For example, a polydimethylsiloxanes (PDMS) layer is applied with a hardened thickness of about 40-70 μm and resistivity of about 108 Ωcm. A patterned aluminum electrode of about 0.5-1 μm is formed by a liftoff process to serve as a top electrode 219 of each pixel, as shown in FIG. 3D. In order to enhance adhesion between the metal electrodes and the PDMS layer, an oxygen plasma activating process can be optionally performed on the surface of the PDMS layer.

Figure 3E:
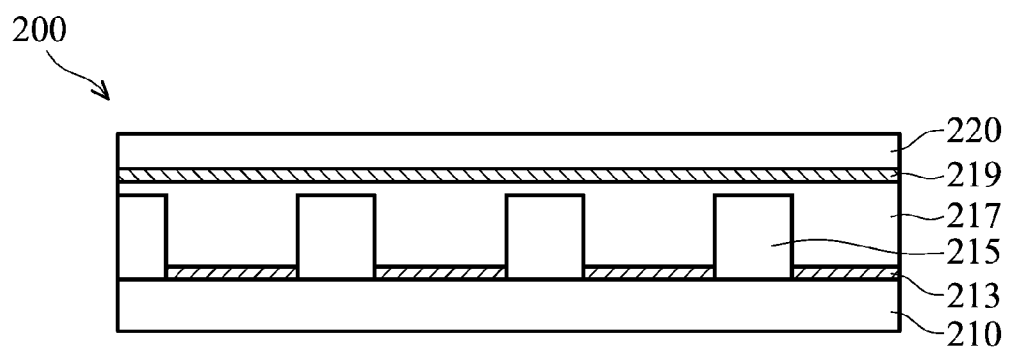

Referring to FIG. 3E, a passivation layer 220 (such as Model Q1-4010 commercially available by Dow Corning corporation) is screen printed covering the top electrodes, thus completing an array of sensor devices 200 with self-aligned electrode structure.

Figure 4A:
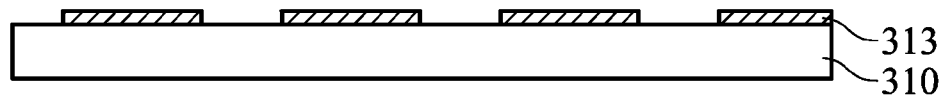
FIGS. 4A-4E are cross sections illustrating each fabrication step for another exemplary embodiment of a display device array of the invention.

FIGS. 4A-4E are cross sections illustrating each fabrication step for another exemplary embodiment of a display device array of the invention. Referring to FIG. 4A, a substrate 310 such as an optical grade polyethylene terephthalate (PET) substrate is provided. Patterned electrodes 313 are subsequently formed on the substrate 310. For example, aluminum electrodes 313 serving as lower electrodes for each pixel are defined on the substrate 310 by using a first photomask (not shown) configured with a lithography process (such as a liftoff process). The dimensions of the patterned electrodes 313 are about 0.5 μm.

Figure 4B:
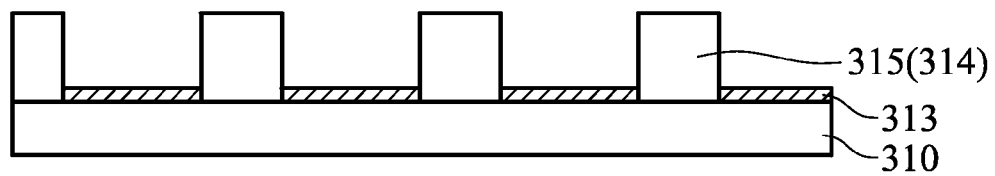

Referring to FIG. 4B, a negative photoresist layer 314 (such as model SU8 2015 which is commercially available by Microchem company) is spun on the substrate 310. Subsequently, a backside ultraviolet (UV) exposure step is performed by using the patterned electrodes 313 as a photomask followed by a post-bake and a develop process to define a spacer structure 315. After a hard-bake process at 200° C., the spacer structure 315 with a thickness of about 30-60 μm is achieved. Since the spacer structure 315 is directly defined by the patterned electrodes 313, the edges of the spacer structure 315 are completely self-aligned with the patterned lower electrodes 313.

Figure 4C:
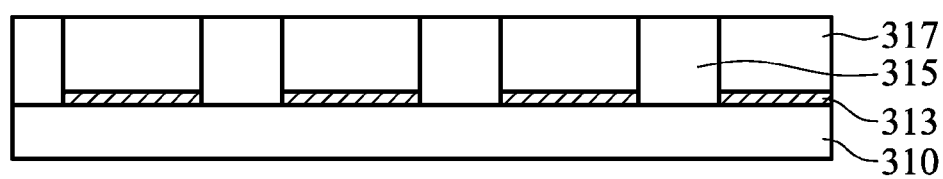

Referring to FIG. 4C, a display medium 317 is formed by a printing or deposition process. For example, the display medium 317 can comprise a cholesteric liquid crystal, a polymer network liquid crystal, a polymer dispersed liquid crystal, an electrophoretic medium (e.g., e-ink or Sipix), fast response liquid phase powders (for example commercially available by Bridgestone), an electrochromic medium (for example commercially available by Netera), a guest-host liquid crystal, and a nano-particle dispersed liquid crystal. The display medium 317 is respectively formed in each of concaved regions which are corresponding to the pixel area defined by the spacer structure 315.

Figure 4D:
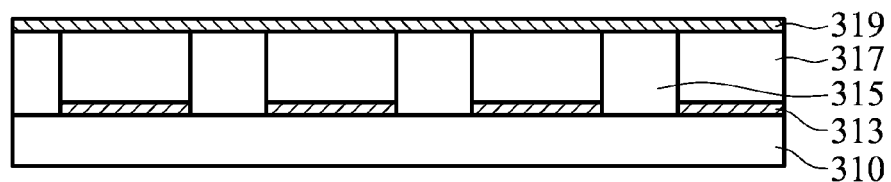

Referring to FIG. 4D, a transparent conductive layer 319 is deposited on the display medium 317 and then patterned as top electrodes for each pixel. The transparent conductive layer 319 can be made of an indium tin oxide (ITO), an aluminum doped zinc oxide, a stibium tin oxide, and a gallium doped zinc oxide.

Figure 4E:
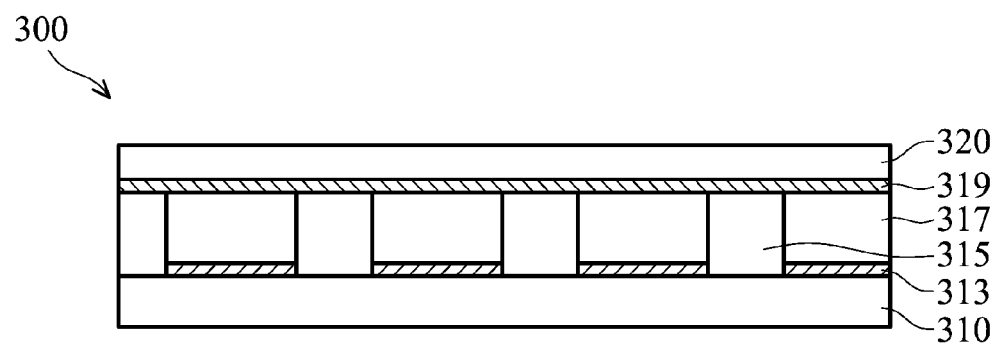

Referring to FIG. 4E, a passivation layer 320 (such as Model Q1-4010 commercially available by Dow Corning corporation) is screen printed covering the top electrodes, thus completing an array of display devices 300 with self-aligned electrode structure.

Figure 5A:
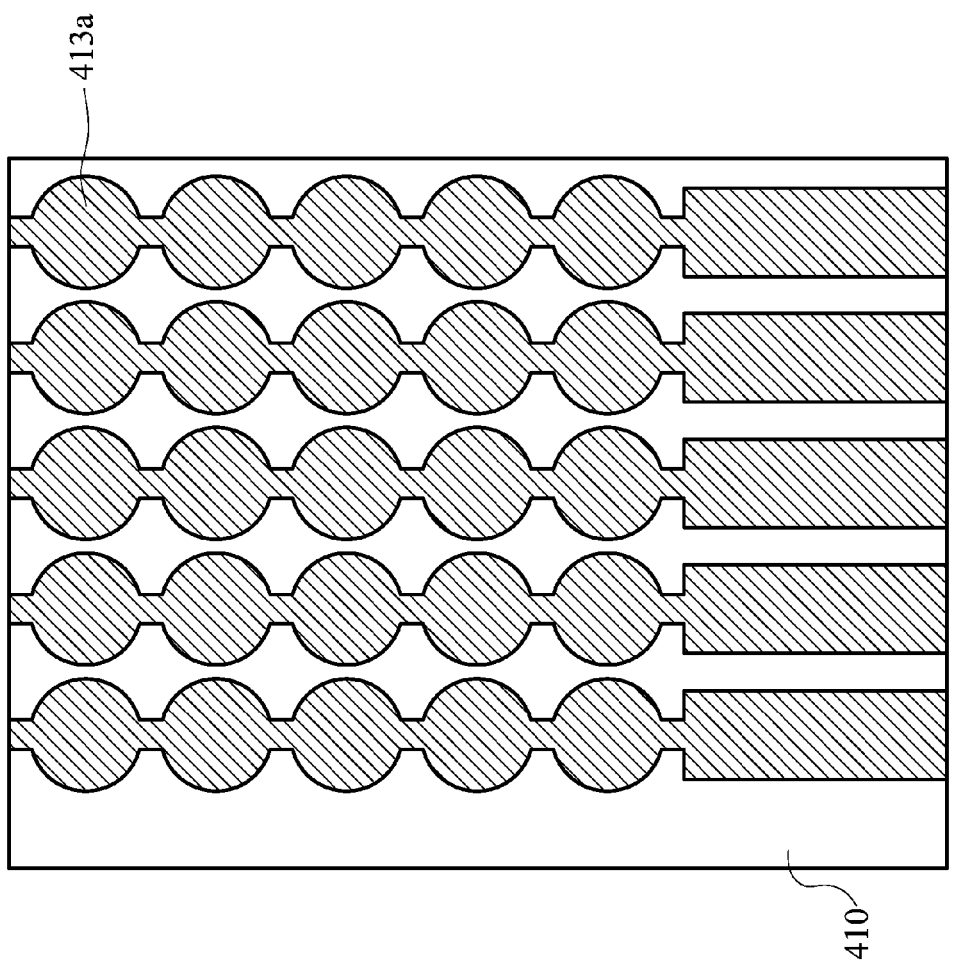
FIGS. 5A and 5B are plan views schematically showing embodiments of the electrode structures of the invention.
Figure 5B:
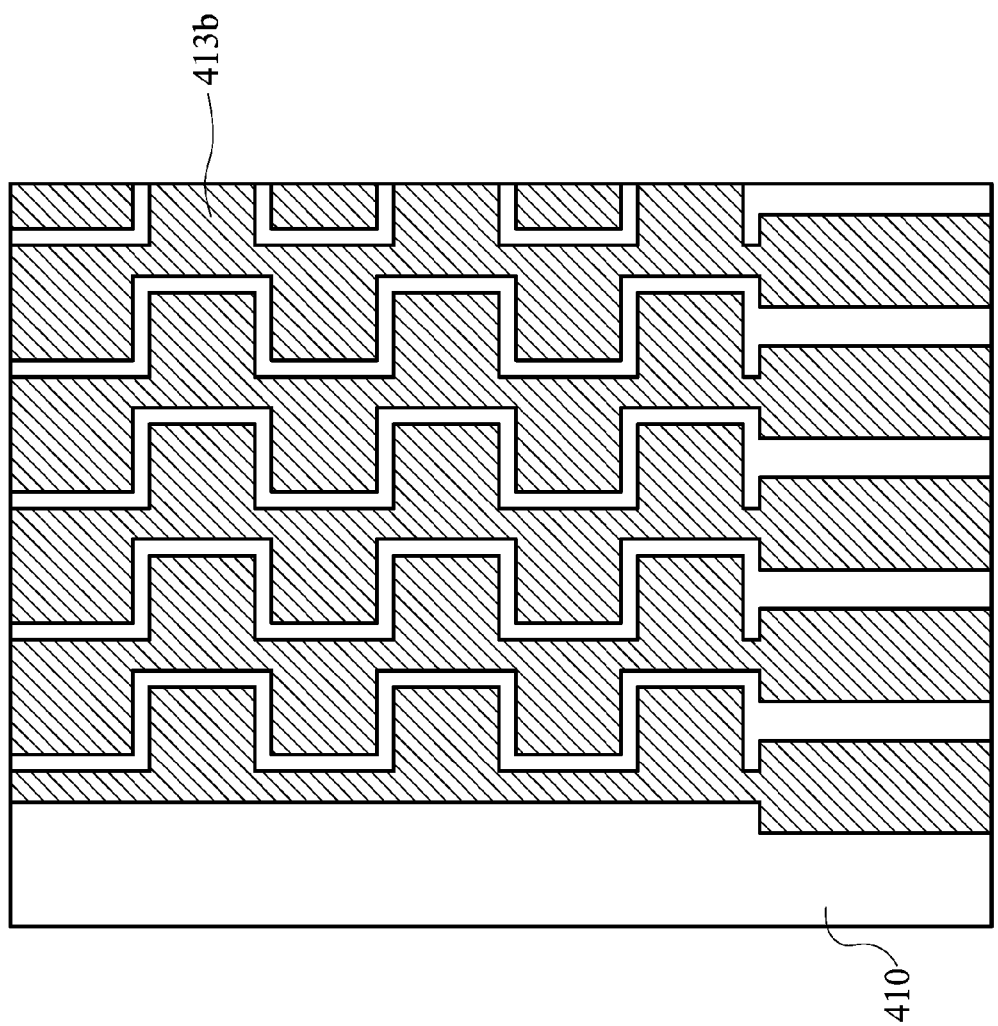

FIGS. 5A and 5B are plan views schematically showing embodiments of the electrode structures of the invention. Referring to FIG. 5A, according to an embodiment of the invention, the patterned lower electrode 413a of each pixel is circular and is longitudinally connected as a peapod pattern extending to contact pads on a peripheral region. Alternatively, the patterned lower electrode 413b of each pixel is square and is longitudinally cross-connected as a zigzag pattern extending to contact pads on a peripheral region, as shown in FIG. 5B. Note that the lower electrode of each pixel is not limited to be circular or square, and other geographic shapes such as an ellipse, rectangular, rhombic, and hexagonal are also applicable to embodiments of the invention.

Figure 6:
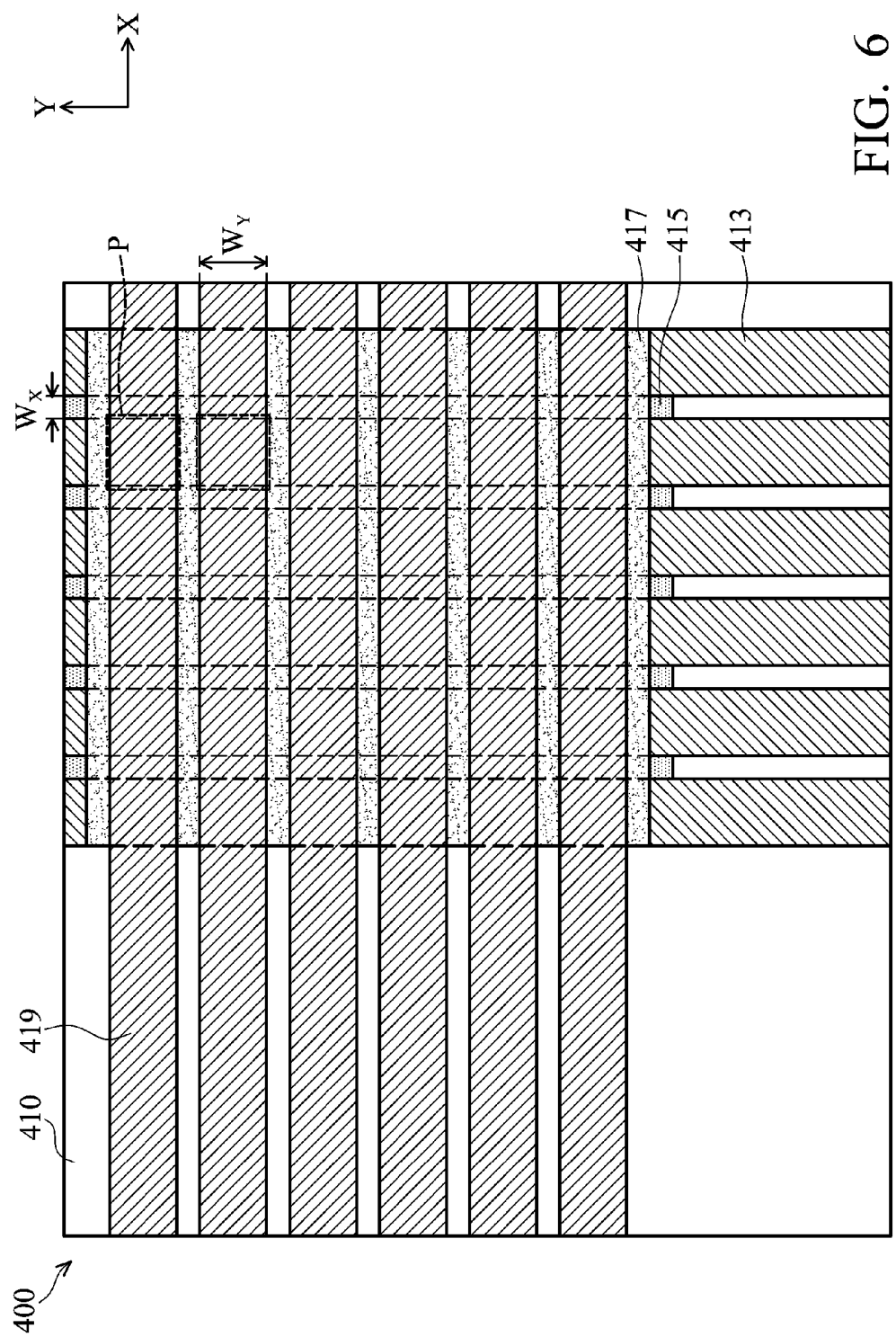
FIG. 6 is a plan view of an embodiment of the functional device array of the invention.

FIG. 6 is a plan view of an embodiment of the functional device array of the invention. The functional device array 400 can be passive matrix (PM) devices, wherein its schematic cross section view prior to formation of the passive layer is similar to FIG. 3D. The arrayed functional device 400 comprises a plurality of stripe-shaped lower electrodes 413 disposed on the transparent substrate 410 along the second direction (Y-axis direction). A spacer structure 415 is formed on the gap between the patterned lower electrodes 413 and self-aligned thereto. A functional structure layer 417 comprising a layer of conductive pressure-sensitive paste is formed on an active region of the transparent substrate 410. The layer of conductive pressure-sensitive paste can comprise a polydimethylsiloxane (PDMS) layer, a polyurethane layer, an acrylic rubber layer, a natural rubber layer, a nitrile rubber layer, a styrene butadiene layer, a butadiene acrylonitrile layer, an isoprene butylene butyl layer, a fluoronated hydrocarbon layer, an ethylene vinyl acetate layer, an ethylene propylene diene layer, an ethylene propylene layer, a polybutadiene layer, a polychloroprene layer, a epichlorohydrin layer, a chlorosulphonated polyethylene layer, a polyethylene terephthalate layer or above combining forms. A plurality of stripe-shaped upper electrodes 419 are formed on the functional structure layer 417 along the first direction (X-axis direction). The functional structure 417 comprises a layer of pressure sensitive conductive, dielectric, piezoelectric, inductive, or magnetic material. The lower electrodes 413 and the upper electrodes 419 extend to the peripheral region of the transparent 410 to serve as contact pads connecting to an external circuitry (not shown). The crossover areas of the lower electrodes 413 and the upper electrodes 419 define pixels P with a width $W_X$ of about 5 μm and a length $W_Y$ of about 5 μm.

Figure 7:
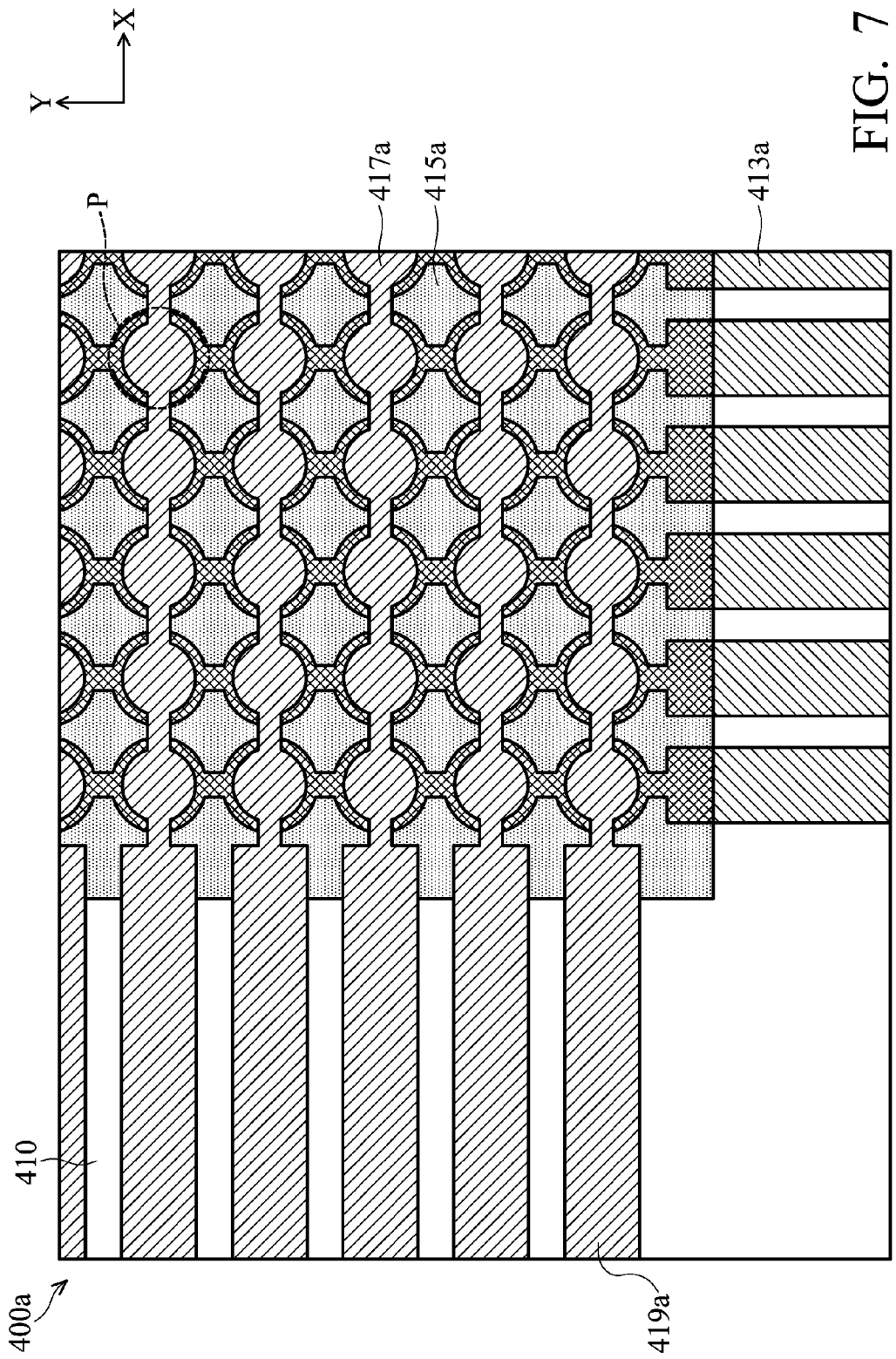
FIG. 7 is a plan view of another embodiment of the functional device array of the invention.

FIG. 7 is a plan view of another embodiment of the functional device array of the invention. Referring to FIG. 7, the functional device array 400a comprises a plurality of stripe-shaped lower electrodes 413a formed on the transparent substrate 410. The lower electrode 413a of each pixel is circular and is connected along the second direction (Y-axis direction) extending to contact pads on a peripheral region, wherein reference may be made to electrodes 413a of FIG. 5A for the structure. A spacer structure 415 is formed on the gap between the patterned lower electrodes 413a and self-aligned thereto. A functional structure layer 417a such as a polydimethylsiloxane (PDMS) layer or a display medium is formed on an active region of the transparent substrate 410. A plurality of stripe-shaped upper electrodes 419a are formed on the functional structure layer 417a along the first direction (X-axis direction). The lower electrodes 413a and the upper electrodes 419a extend to the peripheral region of the transparent 410 to serve as contact pads connecting to an external circuitry (not shown). The crossover areas of the lower electrodes 413a and the upper electrodes 419a define pixels P.

Figure 8:
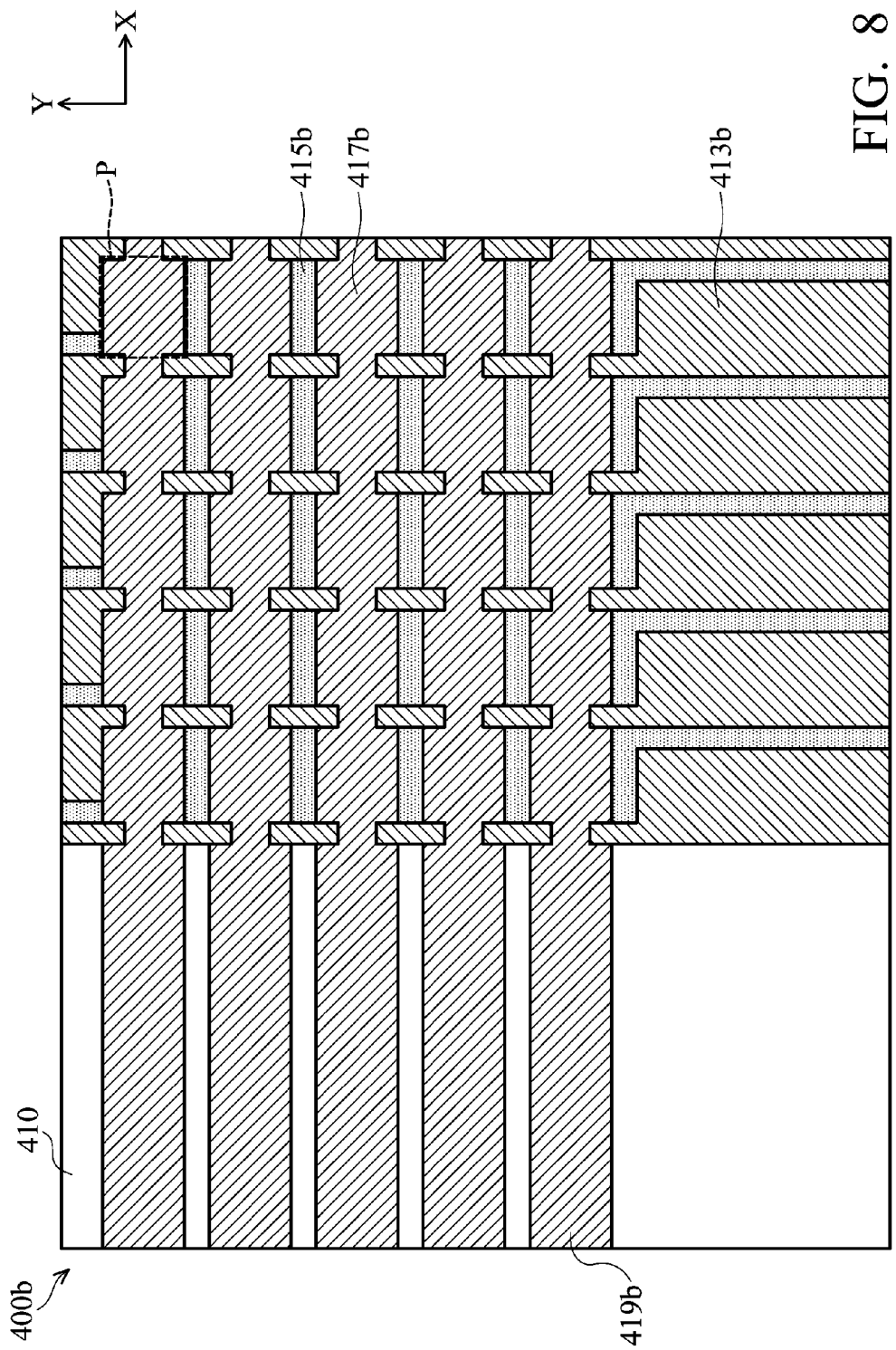
FIG. 8 is a plan view of another embodiment of the functional device array of the invention.

FIG. 8 is a plan view of another embodiment of the functional device array of the invention. Referring to FIG. 8, the functional device array 400b comprises a plurality of stripe-shaped lower electrodes 413b formed on the transparent substrate 410. The lower electrode 413b of each pixel is square and is connected along the second direction (Y-axis direction) extending to contact pads on a peripheral region, wherein reference may be made to electrodes 413b of FIG. 5B for the structure. A spacer structure 415 is formed on the gap between the patterned lower electrodes 413b and self-aligned thereto. A functional structure layer 417b such as a polydimethylsiloxane (PDMS) layer or a display medium is formed on an active region of the transparent substrate 410. A plurality of stripe-shaped upper electrodes 419b are formed on the functional structure layer 417b along the first direction (X-axis direction). The lower electrodes 413b and the upper electrodes 419b extend to the peripheral region of the transparent 410 to serve as contact pads connecting to an external circuitry (not shown). The crossover areas of the lower electrodes 413b and the upper electrodes 419b define pixels P.

Figure 9A:
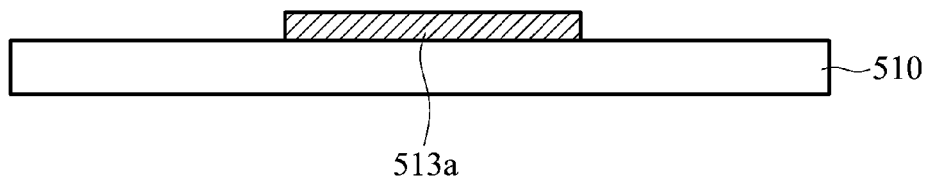
FIGS. 9A-9D are cross sections illustrating each fabrication step for another exemplary embodiment of a dual bottom electrode type sensor device array of the invention.
Figure 9B:
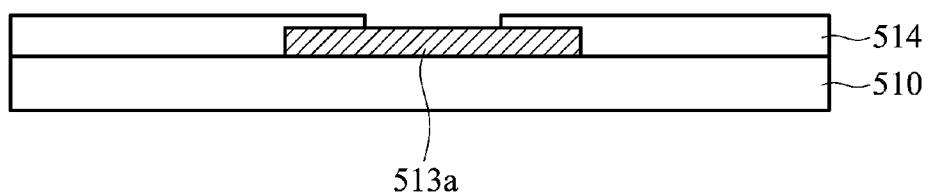

FIGS. 9A-9D are cross sections illustrating each fabrication step for another exemplary embodiment of a dual bottom electrode type sensor device array of the invention. Referring to FIG. 9A, a substrate 510 such as an optical grade polyethylene terephthalate (PET) substrate is provided. Patterned first electrodes 513 are subsequently formed on the substrate 510 by using a first photomask (not shown) configured with a lithography process (such as a liftoff process). An array of electrodes 513 is thus defined on the substrate 510. An insulation layer 514 is formed and patterned on the substrate 510. A portion of the first lower electrodes 513 is thus exposed, as shown in FIG. 9B.

Figure 9C:
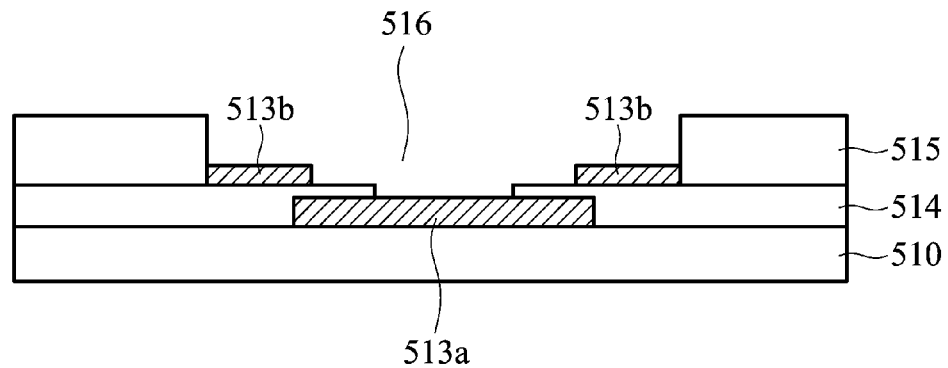

Referring to FIG. 9C, patterned second lower electrodes 513' are formed on the insulation layer 514. The patterned second lower electrodes 513' have ring patterns with inner sides overlapping with the outer sides of the first lower electrodes 513. Subsequently, a negative photoresist layer (such as model SU8 2015 which is commercially available by Microchem Company) is spun on the substrate 510. Subsequently, a backside ultraviolet (UV) exposure step is performed by using the patterned first lower electrodes 513 and second lower electrodes 513' as a photomask followed by a post-bake and a develop process to define a spacer structure 515 at non-electrode areas. Pixel areas 516 are therefore defined by the spacer structure 515.

Figure 9D:
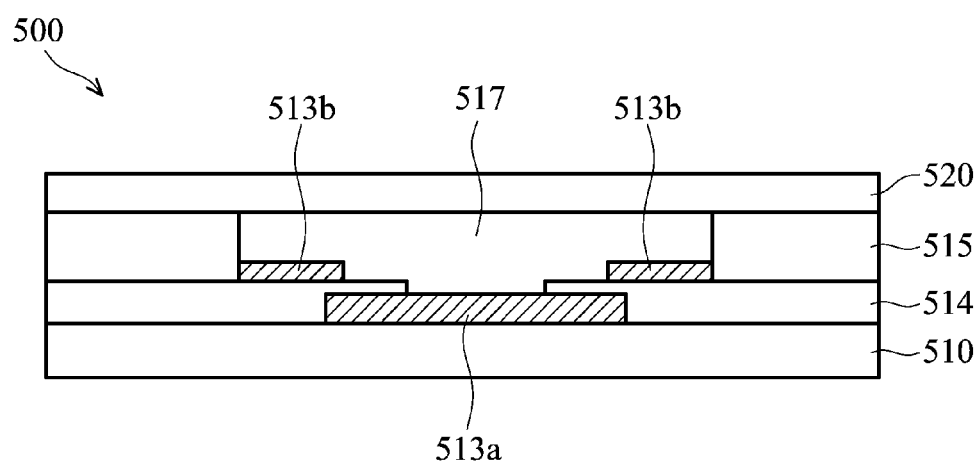

Referring to FIG. 9D, an elastomer layer 517 is applied by a screen printing or by stencil printing process. For example, a polydimethylsiloxanes (PDMS) layer is applied with a hardened thickness of about 40-70 μm and resistivity of about $10^8$ Ωcm. After formation of patterned top electrodes, a passivation layer 520 (such as Model Q1-4010 commercially available by Dow Corning corporation) is screen printed covering the top electrodes, thus completing an array of dual bottom electrodes type sensor devices 500 with self-aligned electrode structure.

Figure 10:
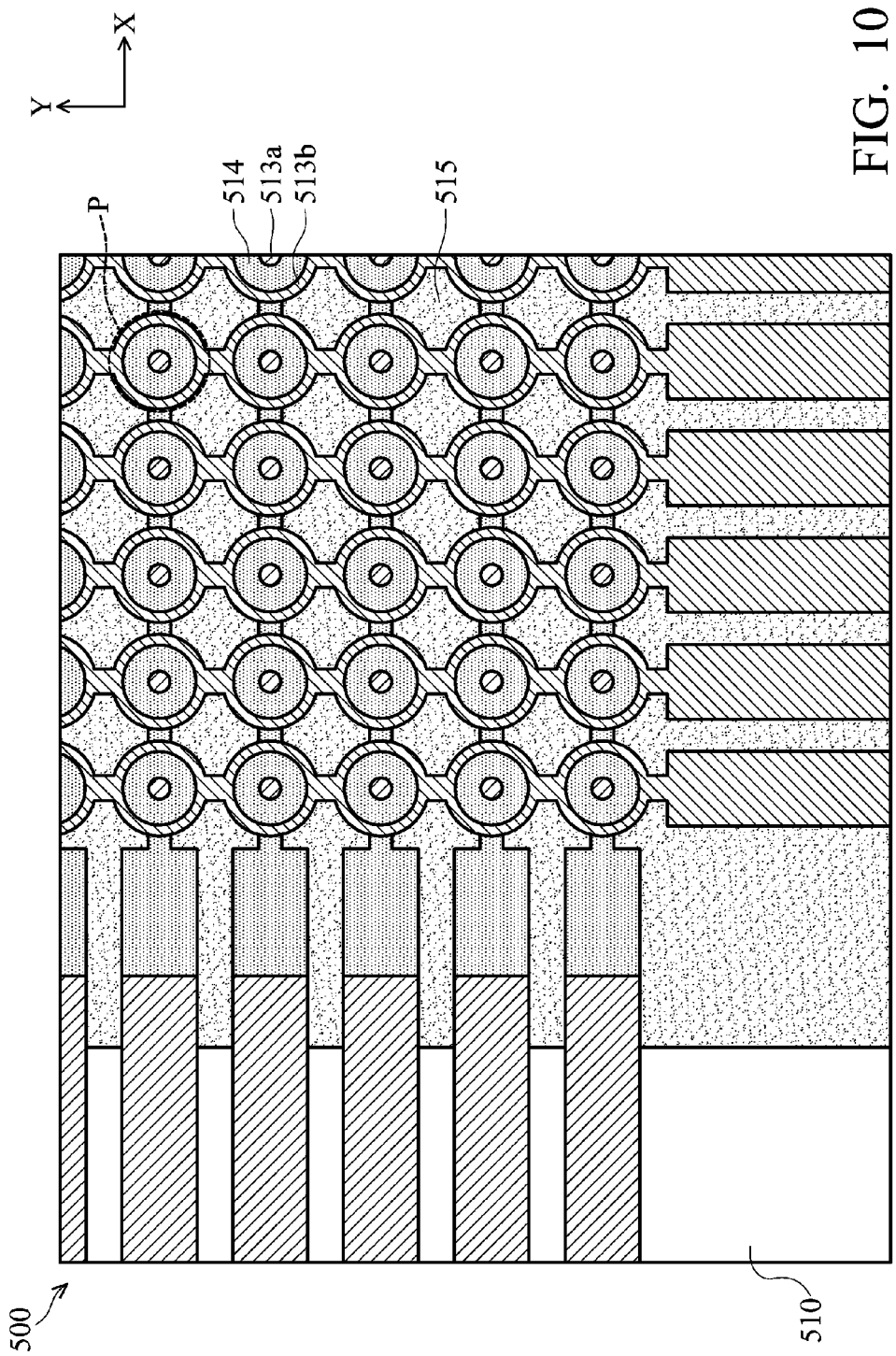
FIG. 10 is a plan view of another embodiment of a dual bottom electrode type sensor device array of the invention.

FIG. 10 is a plan view of another embodiment of a dual bottom electrode type sensor device array 500 of the invention. The plan view of the sensor device array 500 prior to formation of the elastomer layer is similar to FIG. 9C. Referring to FIG. 10, the dual bottom electrode type sensor device array 500 comprises a plurality of stripe-shaped first lower electrodes 513a formed on the transparent substrate 510. The first lower electrode 513a of each pixel is square and is connected to each other along the first direction (X-axis direction) extending to contact pads on a peripheral region. A patterned transparent insulation layer 514 is disposed overlying the substrate 514 exposing a portion of the first lower electrodes 513a. Patterned second lower electrodes 513b with ring patterns are formed on the insulation layer 514 along the second direction (Y-axis direction). A spacer structure 515 is formed on the gap between the patterned first and second lower electrodes and self-aligned thereto. The patterned first lower electrodes 513a and the patterned second lower electrodes 513b extend to the peripheral region of the transparent 510 to serve as contact pads connecting to an external circuitry (not shown). The crossover areas of the patterned first lower electrodes 513a and the patterned second lower electrodes 513b define pixels P.

Figure 11A:
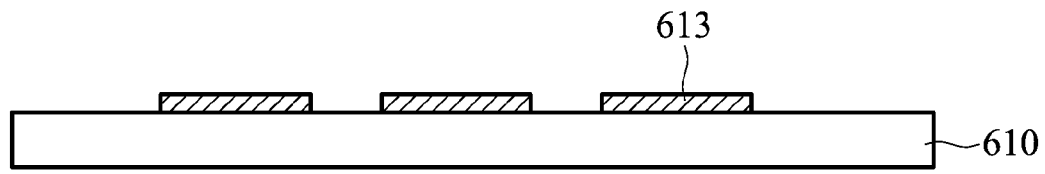
FIGS. 11A-11F are cross sections illustrating each fabrication step for another exemplary embodiment of a touch control device array of the invention.

FIGS. 11A-11F are cross sections illustrating each fabrication step for another exemplary embodiment of a touch control device array of the invention. Referring to FIG. 11A, a substrate 610 such as an optical grade polyethylene terephthalate (PET) substrate with a thickness of 125 μm is provided. Patterned electrodes 613 are subsequently formed on the substrate 610. For example, a conductive silver paste layer 613 serving as lower electrodes for each pixel is applied on the substrate 610 by using a screen printing process. The thickness of the patterned electrodes 613 are about 25 μm.

Figure 11B:
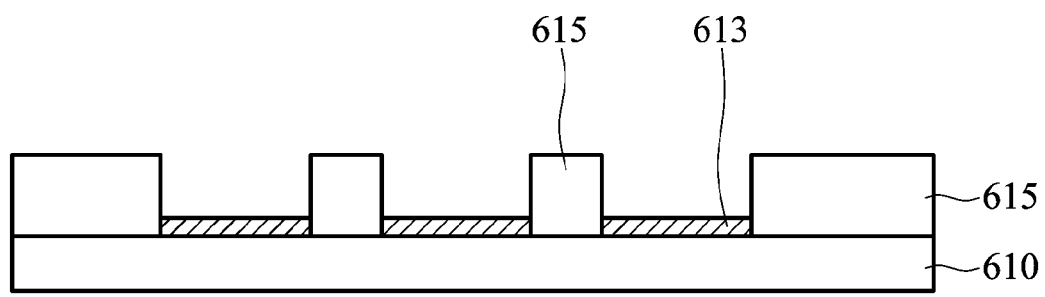

Referring to FIG. 11B, a negative photoresist dry film 615 (such as model PerMX3000 with a thickness of 15 μm which is commercially available by Dupont company) is formed on the substrate 610. Subsequently, a backside ultraviolet (UV) exposure step is performed by using the patterned electrodes 613 as a photomask followed by a post-bake and a develop process to define a spacer structure 615. Since the spacer structure 615 is directly defined by the patterned electrodes 613, the edges of the spacer structure 615 are completely self-aligned with the patterned lower electrodes 613.

Figure 11C:
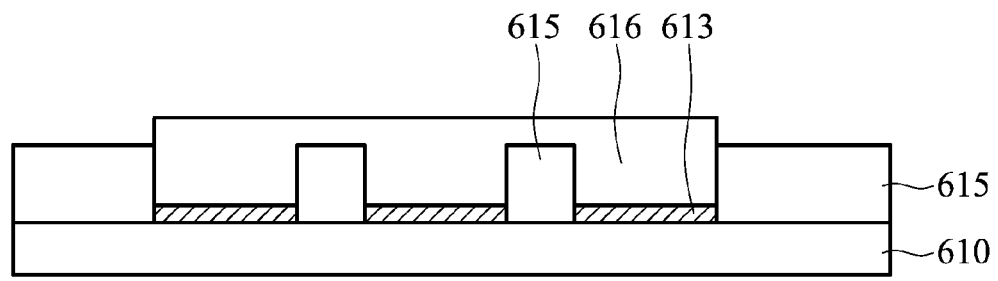

Referring to FIG. 11C, a sacrificial layer 616 with a thickness of 15 μm is formed by a deposition or screen printing process. The sacrificial layer 616 is kept from being cross-linked at this stage.

Figure 11D:
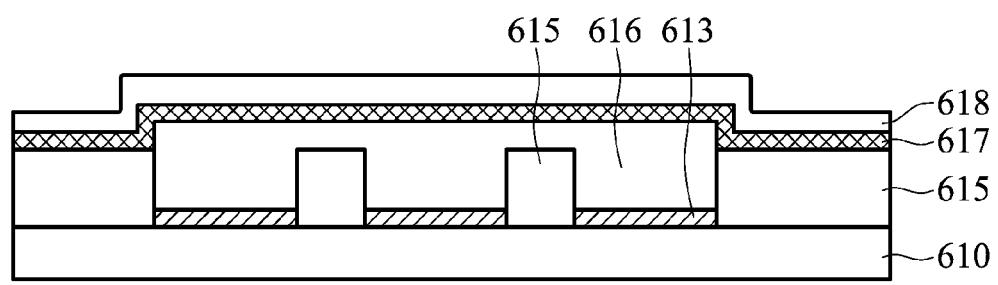
Figure 11E:
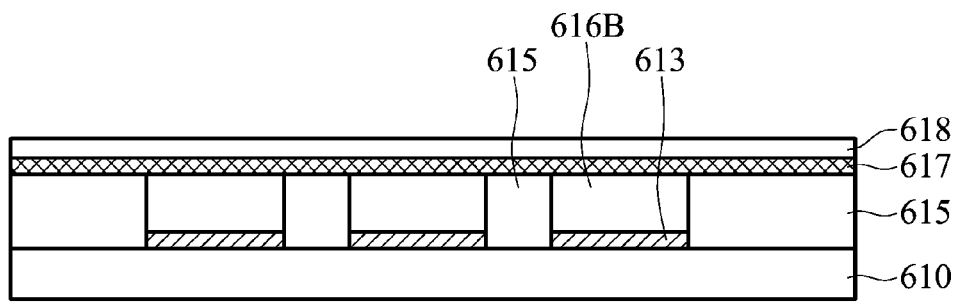

Referring to FIG. 11D, a piezoresistive paste 617 is formed on the conductive silver paste layer 613 and the sacrificial layer 616. For example, a conductive carbon paste is applied with a thickness of about 15 μm and resistivity in a range from about $10^4$ Ωcm to about $10^{10}$ Ωcm. A conductive silver paste layer 618 with a thickness about 25 μm is deposited on the piezoresistive paste 617 to serve as a top electrode of each pixel. The sacrificial layer 616 is then removed leaving a gap 616B or a cavity, as shown in FIG. 11E.

Figure 11F:
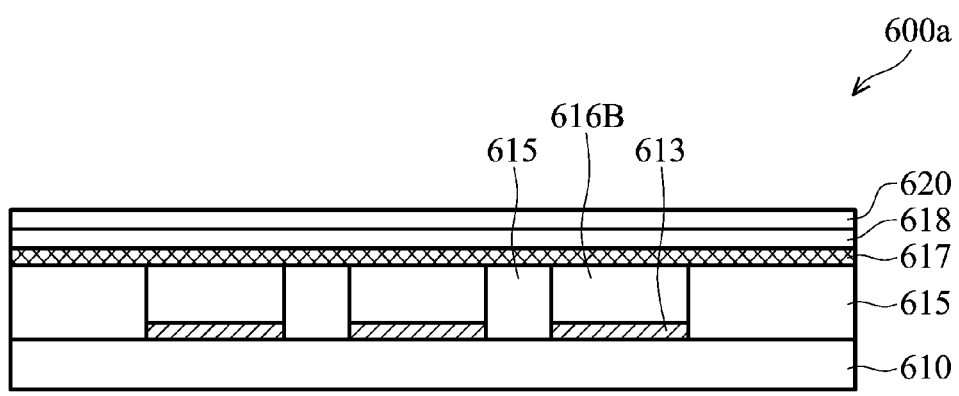

Referring to FIG. 11F, a passivation layer 620 (such as Model Q1-4010 commercially available by Dow Corning corporation) is screen printed covering the top electrodes 618, thus completing an array of touch control devices 600a with self-aligned electrode structure.

Figure 12:
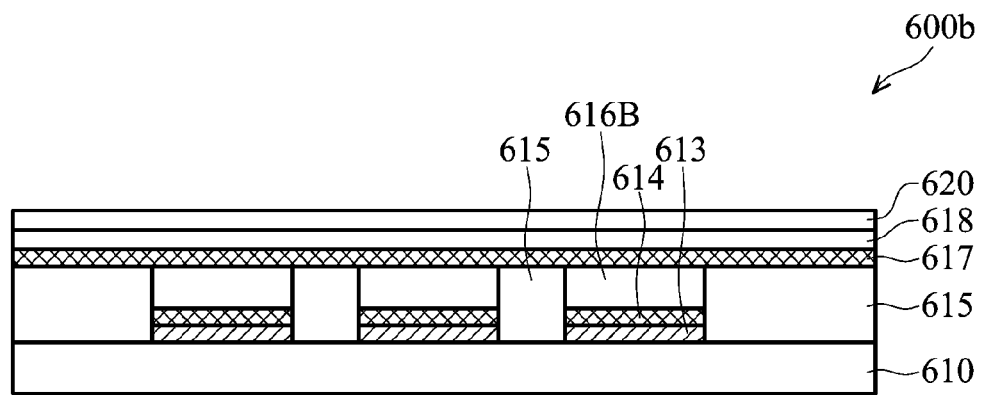
FIG. 12 is a cross section of another embodiment of the a touch control device array of the invention.

FIG. 12 is a cross section of another embodiment of the a touch control device array of the invention. Note that the structure and fabrication of the a touch control device array 600b of FIG. 12 are nearly identical to the a touch control device array 600a of FIG. 11E and for simplicity its detailed description is omitted. The embodiment of the touch control device array 600b is different from the embodiment of the touch control device array 600a in that an additional piezoresistive paste 614 (for example a conductive carbon paste) is formed on the patterned electrodes 613. Therefore, the lower electrode 614 and upper electrode 617 on both sides of each gap 616B are composed of the piezoresistive paste.

Figure 13A:
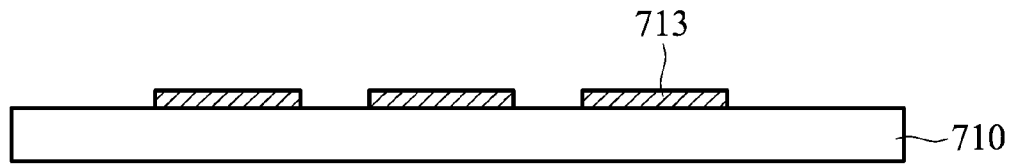
FIGS. 13A-13F are cross sections illustrating each fabrication step for another exemplary embodiment of a touch control device array of the invention.

FIGS. 13A-13F are cross sections illustrating each fabrication step for another exemplary embodiment of a touch control device array 700 of the invention. Referring to FIG. 13A, a substrate 710 such as an optical grade polyethylene terephthalate (PET) substrate with a thickness of 125 μm is provided. Patterned electrodes 713 are subsequently formed on the substrate 710. For example, a conductive silver paste layer 713 serving as lower electrodes for each pixel is applied on the substrate 710 by using screen printing. The thickness of the patterned electrodes 713 are about 25 μm.

Figure 13B:
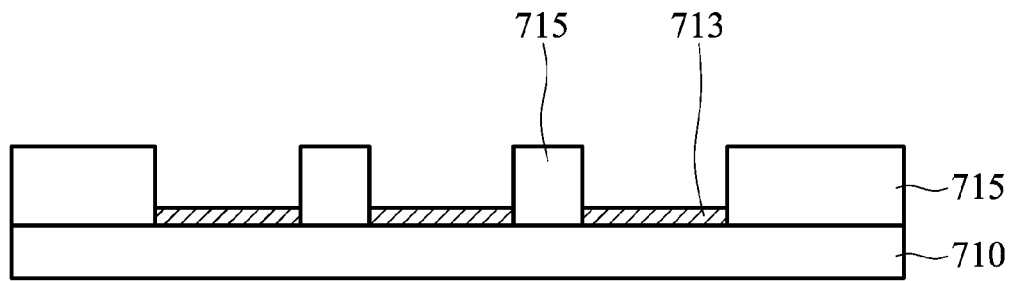

Referring to FIG. 13B, a negative photoresist dry film 715 (such as model PerMX3000 with a thickness of 15 μm which is commercially available by Dupont company) is formed on the substrate 710. Subsequently, a backside ultraviolet (UV) exposure step is performed by using the patterned electrodes 713 as a photomask followed by a post-bake and a develop process to define a spacer structure 715. Since the spacer structure 715 is directly defined by the patterned electrodes 613, the edges of the spacer structure 715 are completely self-aligned with the patterned lower electrodes 713.

Figure 13C:
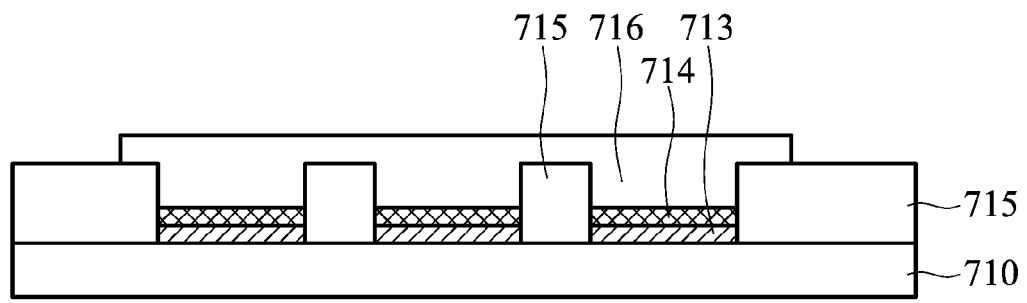

Referring to FIG. 13C, an additional piezoresistive paste 714 (for example a conductive carbon paste) is formed on the patterned electrodes 713 with a thickness of about 5 μm and resistivity of about $10^5$ Ωcm. A sacrificial layer 616 with a thickness of 15 μm is formed by deposition or screen printing. The sacrificial layer 616 is kept from being cross-linked at this stage.

Figure 13D:
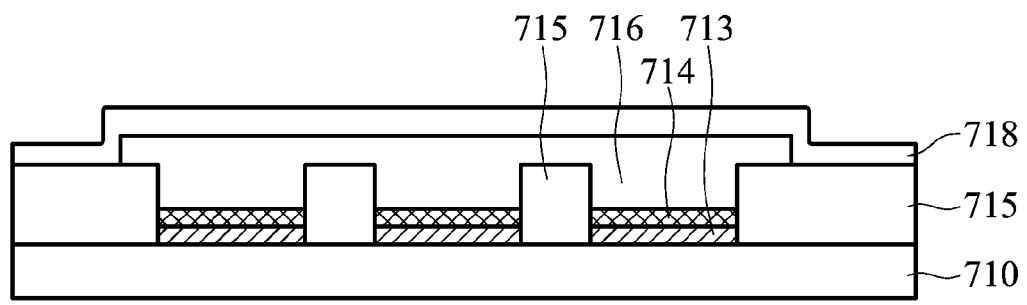
Figure 13E:
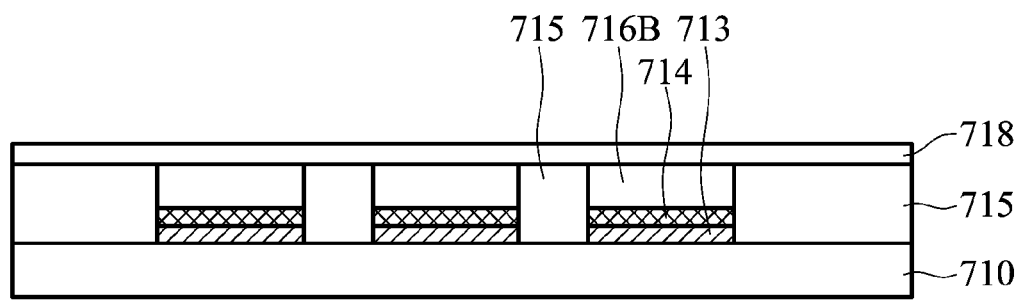

Referring to FIG. 13D, a conductive silver paste layer 718 with a thickness of about 25 μm is deposited on the spacer structure 715 and the sacrificial layer 716 serves as a top electrode of each pixel. The sacrificial layer 716 is then removed leaving a gap 716B or a cavity, as shown in FIG. 13E.

Figure 13F:
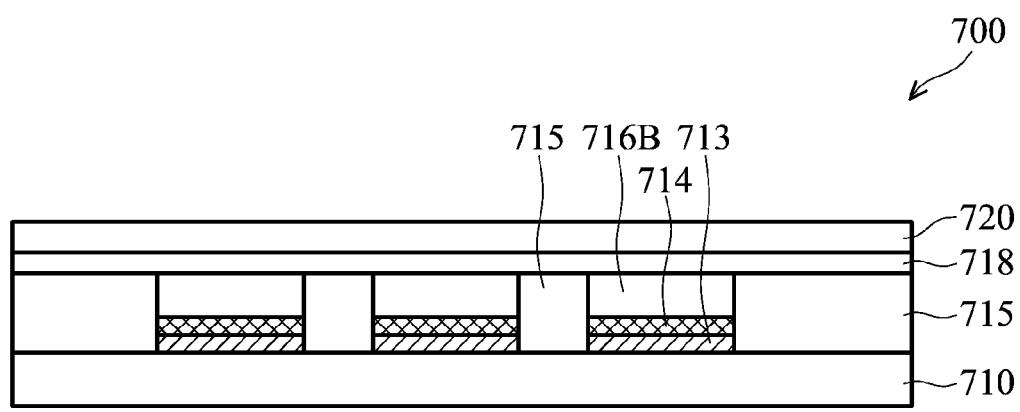

Referring to FIG. 13F, a passivation layer 720 (such as Model Q1-4010 commercially available by Dow Corning corporation) is screen printed covering the top electrodes 718, thus completing an array of touch control devices 700 with self-aligned electrode structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sensor device array with self-aligned electrode structures, comprising:
    a transparent substrate;
    a lower electrode array comprising lower electrodes disposed on the transparent substrate;
    a plurality of spacer structures disposed on the transparent substrate, at a gap between the lower electrodes, and self-aligned with the lower electrode array;
    a functional structure disposed on a pixel region array defined by the plurality of spacer structures, wherein the functional structure has portions in pixel regions of the pixel region array, and neighboring portions of the functional structure are connected over the spacer structures;
    a patterned upper electrode disposed directly on the functional structure corresponding to the pixel region array thereby forming a direct electrical connection; and
    a passivation layer disposed on the patterned upper electrode covering the functional structure, wherein the functional structure includes a layer of polymeric pressure sensitive material filled into cavities formed by the spacer structures.

2. The sensor device array as claimed in claim 1, wherein the transparent substrate comprises transparent polyetheretherketone, polyethylene naphthalate, blocked isocyanates, silicone based elastomers, polyamides, polyimides, aromatic fluorine polyesters, polyethersulfone, polysulfones, polyacrylates, polycarbonates, poly (styrene-diene) block copolymers, poly (vinyl halides), polyurethanes, poly (urethane acrylates), poly (urethane methacrylates), poly (dimethyl siloxanes), polyetherimides, polymethacrylates, polyolefins, poly (ethylene-acrylate) copolymers, poly (ethylene-methacrylate) copolymers, polyethylene terephthalate, polynaphthalene terephthalate, polydienes, or ionomers.

3. The sensor device array as claimed in claim 1, wherein each of the patterned lower electrodes is circular and is longitudinally connected as a peapod pattern extending to contact pads on a peripheral region.

4. The sensor device array as claimed in claim 1, wherein each of the patterned lower electrodes is square and is longitudinally cross-connected as a zigzag pattern extending to contact pads on a peripheral region.

5. The sensor device array as claimed in claim 1, wherein edges of the plurality of spacer structures are completely aligned with the patterned lower electrodes.

6. The sensor device array as claimed in claim 1, wherein the functional device array comprises a sensor device array.

7. The sensor device array as claimed in claim 6, wherein the functional structure comprises a layer of pressure sensitive conductive, dielectric, piezoelectric, inductive, or magnetic material.

8. The sensor device array as claimed in claim 7, wherein the layer of conductive pressure-sensitive paste comprises a polydimethylsiloxane (PDMS) layer, a polyurethane layer, an acrylic rubber layer, a natural rubber layer, a nitrile rubber layer, a styrene butadiene layer, a butadiene acrylonitrile layer, an isoprene butylene butyl layer, a fluoronated hydrocarbon layer, an ethylene vinyl acetate layer, an ethylene propylene diene layer, an ethylene propylene layer, a polybutadiene layer, a polychloroprene layer, a epichlorohydrin layer, a chlorosulphonated polyethylene layer, a polyethylene terephthalate layer or above combining forms.

9. The sensor device array as claimed in claim 1, wherein the functional device array comprises a display device array.

10. The sensor device array as claimed in claim 9, wherein the functional structure is a layer of a display medium comprising a cholesteric liquid crystal, a polymer network liquid crystal, a polymer dispersed liquid crystal, an electrophoretic medium, fast response liquid phase powders, an electrochromic medium, a guest-host liquid crystal, and a nano-particle dispersed liquid crystal.

11. The sensor device array as claimed in claim 9, wherein the patterned upper electrode is a transparent conductive oxide comprising an indium tin oxide (ITO), an aluminum doped zinc oxide, a stibium tin oxide, a gallium doped zinc oxide and carbon nanotube, and conductive polymer.

12. The sensor device array as claimed in claim 1, wherein the functional device array comprises a touch controlled device array.

13. The sensor device array as claimed in claim 12, wherein the functional structure is a pressure-sensitive layer comprising a conductive, dielectric, piezoelectric, inductive, or magnetic material.

14. The sensor device array as claimed in claim 12, further comprising a gap between the patterned lower electrode array and the patterned upper electrode.

15. The sensor device array as claimed in claim 12, further comprising an additional pressure-sensitive layer disposed on the patterned lower electrode array.

16. The sensor device array as claimed in claim 1, wherein the lower electrode array is a patterned lower electrode array.

17. The functional device array as claimed in claim 1, wherein the lower electrode array is a patterned lower electrode array.

18. The sensor device array as claimed in claim 1, wherein the functional structure directly contacts the lower electrode array.

19. The sensor device array as claimed in claim 1, wherein the functional structure comprises segments and bottom parts of the segments are separated from each other by the spacer structures.

20. The sensor device array as claimed in claim 1, wherein the polymeric pressure sensitive material is a polydimethylsiloxanes (PDMS) layer.

21. The sensor device array as claimed in claim 1, wherein the polymeric pressure sensitive material extends over the spacer structures to join with polymeric pressure sensitive material in adjacent cavities.

22. A sensor device structure with self-aligned electrode structures, comprising:
   a transparent substrate;
   a lower electrode array on the transparent substrate;
   spacer structures comprising a negative photoresist disposed on the transparent substrate, at gaps between lower electrodes of the lower electrode array, and self-aligned with the lower electrode array;
   a functional structure on a pixel region array defined by the plurality of spacer structures, wherein the functional structure has portions in pixel regions of the pixel region array, and neighboring portions of the functional structure are connected over the spacer structures;
   a patterned upper electrode disposed directly on the functional structure corresponding to the pixel region array thereby forming a direct electrical connection; and
   a passivation layer on the patterned upper electrode covering the functional structure, wherein the functional structure includes a layer of polymeric pressure sensitive material filled into cavities formed by the spacer structures.

23. The sensor device structure as claimed in claim 22, wherein the transparent substrate comprises a transparent polyethylene terephthalate (PET), polyetheretherketone, polyethylene naphthalate, blocked isocyanates, silicone based elastomers, polyamides, polyimides, aromatic fluorine polyesters, polyethersulfone, polysulfones, polyacrylates, polycarbonates, poly (styrene-diene) block copolymers, poly (vinyl halides), polyurethanes, poly (urethane acrylates), poly (urethane methacrylates), poly (dimethyl siloxanes), polyetherimides, polymethacrylates, polyolefins, poly (ethylene-acrylate) copolymers, poly (ethylene-methacrylate) copolymers, polyethylene terephthalate, polynaphthalene terephthalate, polydienes, or ionomer substrate.

24. The sensor device structure as claimed in claim 22, wherein each of the patterned lower electrodes is circular and is longitudinally connected as a peapod pattern extending to contact pads on a peripheral region.

25. The sensor device structure as claimed in claim 22, wherein each of the patterned lower electrodes is square and is longitudinally cross-connected as a zigzag pattern extending to contact pads on a peripheral region.

26. The sensor device structure as claimed in claim 22, wherein formation of the functional structure on a pixel region array is performed by screen-printing the functional structure.

27. The sensor device structure as claimed in claim 22, wherein formation of the functional structure on a pixel region array comprises printing a display medium.

28. The sensor device structure as claimed in claim 27, wherein the display medium comprises a cholesteric liquid crystal, a polymer network liquid crystal, a polymer dispersed liquid crystal, an electrophoretic medium, fast response liquid phase powders, a electrochromic medium, a guest-host liquid crystal, and a nano-particle dispersed liquid crystal.

29. The sensor device structure as claimed in claim 22, wherein the patterned upper electrode comprises a transparent conductive oxide comprising an indium tin oxide (ITO), an aluminum doped zinc oxide, a stibium tin oxide, a gallium doped zinc oxide, carbon nanotube, and conductive polymer.

30. The sensor device structure as claimed in claim 22, wherein the lower electrode array is a patterned lower electrode array.

31. The sensor device structure as claimed in claim 22, wherein the functional structure directly contacts the lower electrode array.

32. The sensor device structure as claimed in claim 22, wherein the functional structure comprises segments and bottom parts of the segments are separated from each other by the spacer structures.

33. The sensor device structure as claimed in claim 22, wherein the polymeric pressure sensitive material is a polydimethylsiloxanes (PDMS) layer.

34. The sensor device structure as claimed in claim 22, wherein the polymeric pressure sensitive material extends over the spacer structures to join with polymeric pressure sensitive material in adjacent cavities.

* * * * *